US007400183B1

(12) United States Patent
Sivadasan et al.

(10) Patent No.: US 7,400,183 B1
(45) Date of Patent: Jul. 15, 2008

(54) VOLTAGE CONTROLLED OSCILLATOR DELAY CELL AND METHOD

(75) Inventors: Mohandas Palatholmana Sivadasan, Bangalore (IN); Gajendar Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/415,588

(22) Filed: May 1, 2006

Related U.S. Application Data

(60) Provisional application No. 60/678,397, filed on May 5, 2005.

(51) Int. Cl.
*H03H 11/26* (2006.01)

(52) U.S. Cl. .......................... 327/261; 327/52; 327/287

(58) Field of Classification Search ....................... None
See application file for complete search history.

(56) References Cited

U.S. PATENT DOCUMENTS

| | | | | |
|---|---|---|---|---|
| 5,530,444 | A * | 6/1996 | Tice et al. | 341/156 |
| 5,748,048 | A | 5/1998 | Moyal | 331/34 |
| 5,764,714 | A | 6/1998 | Stansell et al. | 375/377 |
| 5,822,387 | A | 10/1998 | Mar | 375/376 |
| 5,886,582 | A | 3/1999 | Stansell | 331/1 A |
| 5,896,068 | A | 4/1999 | Moyal | 331/34 |
| 5,952,888 | A | 9/1999 | Scott | 331/2 |
| 6,026,134 | A | 2/2000 | Duffy et al. | 375/376 |
| 6,172,571 | B1 | 1/2001 | Moyal et al. | 331/11 |
| 6,211,741 | B1 | 4/2001 | Dalmia | 331/11 |
| 6,275,117 | B1 | 8/2001 | Abugharbieh et al. | 331/57 |
| 6,294,962 | B1 | 9/2001 | Mar | 331/57 |
| 6,307,413 | B1 | 10/2001 | Dalmia et al. | 327/166 |
| 6,310,521 | B1 | 10/2001 | Dalmia | 331/11 |
| 6,377,646 | B1 | 4/2002 | Sha | 375/376 |
| 6,404,294 | B1 | 6/2002 | Sha et al. | 331/57 |
| 6,466,078 | B1 | 10/2002 | Stiff | 327/536 |
| 6,560,306 | B1 | 5/2003 | Duffy et al. | 375/376 |
| 6,597,212 | B1 * | 7/2003 | Wang et al. | 327/117 |
| 6,680,632 | B1 | 1/2004 | Meyers et al. | 327/155 |
| 6,683,930 | B1 | 1/2004 | Dalmia | 375/376 |
| 6,686,787 | B2 * | 2/2004 | Ling | 327/203 |
| 6,690,224 | B1 | 2/2004 | Moore | 327/296 |
| 6,782,068 | B1 | 8/2004 | Wilson et al. | 375/376 |
| 6,911,857 | B1 | 6/2005 | Stiff | 327/281 |

* cited by examiner

*Primary Examiner*—N. Drew Richards
*Assistant Examiner*—An T. Luu
(74) *Attorney, Agent, or Firm*—Haverstock & Owens, LLP

(57) ABSTRACT

A delay cell circuit (200) is disclosed. The delay cell circuit may include a differential stage (202) and a cross-coupled stage (204). The cross-coupled stage can include resistors (210-0 and 210-1) the function to reduce a gain. The differential stage (202) and cross-coupled stage (204) can include variable currents sources (208 and 212), respectively. As frequency of operation increases, variable current source (208) provides a larger current to the differential stage (202) and variable current source (212) provides a smaller current to cross-coupled stage (204). Delay cell circuit (200) may be used in a voltage controlled oscillator (VCO). By including gain attenuating devices such as resistors (210-0 and 210-1), a frequency tuning range of the VCO may be increased.

7 Claims, 3 Drawing Sheets

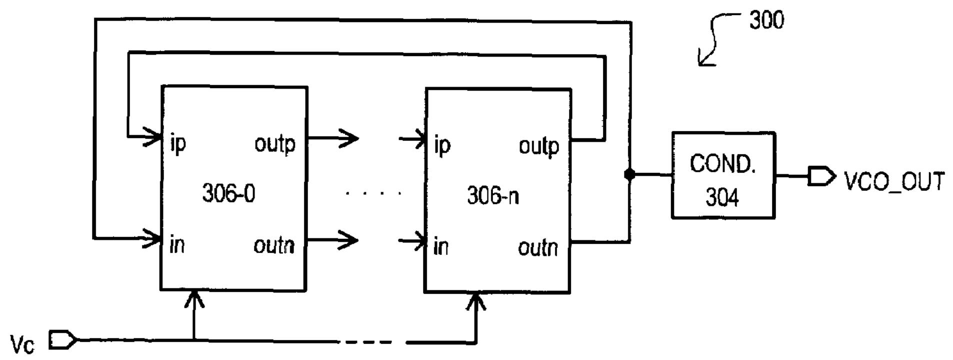
FIG. 3
| Control voltage | Old circuit frequency (MHz) | New circuit (R2=75Ω) frequency (MHz) | New circuit (R2=150Ω) frequency (MHz) |
|---|---|---|---|
| 100m | 447.2 | 440 | 438.0 |
| 105m | 427.6 | 420.5 | 418.6 |
| 110m | 409.5 | 402.5 | 400.6 |
| 115m | No oscillations | 386.0 | 384.1 |
| 120m | No oscillations | 370.8 | 369.0 |
| 125m | No oscillations | 357.1 | 355.3 |
| 130m | No oscillations | 344.7 | 343.0 |
| 135m | No oscillations | 333.6 | 331.9 |
| 140m | No oscillations | No oscillations | 322.2 |
| 145m | No oscillations | No oscillations | 313.5 |
| 150m | No oscillations | No oscillations | 306.0 |
FIG. 4
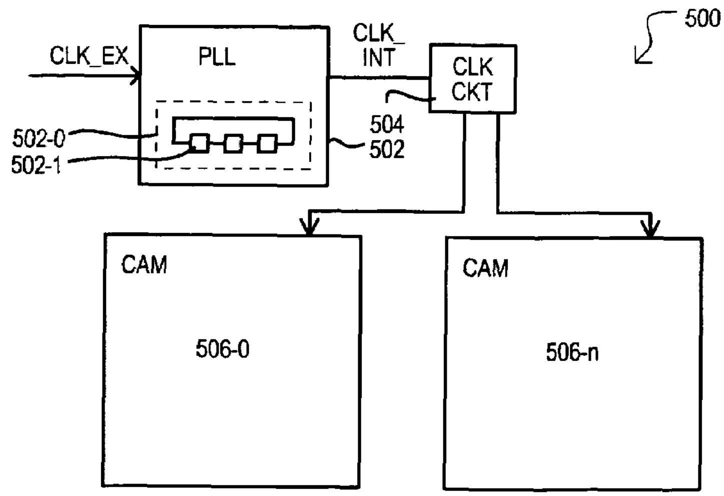
FIG. 5

VOLTAGE CONTROLLED OSCILLATOR DELAY CELL AND METHOD

This application claims the benefit of U.S. provisional patent application Ser. No. 60/678,397, filed May 5, 2005, the contents of which are incorporated by reference herein.

TECHNICAL FIELD

The present invention relates generally to delay circuits, and more particularly to a voltage controlled delay circuit for use in a voltage controlled oscillator.

BACKGROUND OF THE INVENTION

Phase locked loop (PLL) circuits can be utilized in a wide variety of applications, including timing applications for integrated circuits. A typical PLL can include a phase detector that determines a phase difference between a received signal and a feedback signal, a loop filter that can derive a control voltage from the phase difference indicated by the phase detector, and a voltage controlled oscillator (VCO) that can generate a feedback signal having an oscillation frequency corresponding to the control voltage. In some arrangements, the VCO output signal may be frequency divided before being returned to the phase detector.

A VCO can take many forms. In one particular configuration, a VCO can utilize a "ring" oscillator. A ring oscillator can include a number of delay stages (i.e. cells) configured in series and fed back to form a ring. Typically, a ring oscillator includes an odd number or inverting stages. In this way, a signal propagating through the ring can be inverted by such stages and the negative feedback feature of having an odd number of stages generates an oscillation. In a VCO application, a delay introduced by each stage can be established according to a control voltage to thereby generate an oscillation based on the control voltage.

In many applications, a VCO can be the most critical portion of a PLL. For example, in some applications it may be desirable for a PLL circuit to have a wide input/output frequency range without having to adjust/include divider circuits. In such a case, a VCO response can limit the range over which a PLL can operate.

A conventional delay cell of a VCO is set forth in FIG. 6 and designated by the general reference character 600. Conventional VCO delay cell 600 can include a differential stage 602 and a cross-coupled stage 604. Conventional VCO delay cell 600 receives a differential input voltage (ip and in) and provides a differential output voltage (outp and outn).

Differential stage 602 can include transistors (M1 and M2) that form a differential pair, a resistor-capacitor load (RL and CL), and a variable current source 606. Transistors (M1 and M2) receive differential input voltage (ip and in) at respective gate terminals. Transistor M1 has a drain connected to the first differential output node outp and a source commonly connected to the source of transistor M2. Transistor M2 has a drain connected to the second differential output node outn. A resistor-capacitor load (RL and CL) is connected to each differential output node (outn and outp). Variable current source 606 is connected between the common source node of transistors (M1 and M2) and a ground.

Differential stage draws a current shown as current I0. Current I0 is the combined current through transistors (M1 and M2).

Variable current source 606 includes a constant current component that draws a current (2I) and a variable current component that provides a current (I/2−Ivc, where Ivc is a voltage controlled current).

Cross-coupled stage 604 can include cross-coupled transistors (M3 and M4) and variable current source 608. Transistor M3 has a drain connected to differential output node outp, a gate connected to differential output node outn, and a source commonly connected to a source of transistor M3. Transistor M4 has a drain connected to differential output node outn and a gate connected to differential output node outp. Variable current source 608 is connected between commonly connected sources of transistors (M3 and M4) and a ground.

Cross-coupled stage draws a current shown as current I1. Current I1 is the combined current through transistors (M3 and M4).

Variable current source 608 includes a constant current component that draws a current (I) and a variable current component that provides a current (I/2+Ivc, where Ivc is a voltage controlled current).

In a conventional VCO employing a conventional VCO delay cell 600 as illustrated in FIG. 6, an output frequency can be proportional to 1/(RL*CL), where RL is the resistance value of load resistor RL and CL is the capacitance value of load capacitor CL, and currents I0/I1 at a fixed control voltage Vc. The current Ivc can be proportional to a control voltage Vc in a range of −I/2 to I/2.

In the conventional case shown, at a maximum frequency, a current Ivc=I/2, and essentially all current drawn can be through the differential pair (M1 and M2) of differential stage 602 and essentially no current is drawn through cross-coupled pair (M3 and M4) of cross-coupled stage 604 (i.e., I0=2I and I1=0). At a minimum frequency, current Ivc=−I/2, and essentially equal current can flow through both differential pair (M1 and M2) of differential stage 602 and cross-coupled pair (M3 and M4) of cross-coupled stage 604 (i.e., I0=I1=1).

A drawback to conventional VCO delay cell 600 is that the tuning range (range of frequencies at which a lock can occur) can be limited unless post VCO voltage dividers are adjusted. In particular, a lower frequency range may be limited. If a ratio between current (I0) sourced by differential pair (M1 and M2) and current (I1) sourced by cross-coupled pair (M3 and M4) falls below one, a ring oscillator may cease oscillating.

In light of the above, it would be desirable to provide a VCO delay cell that may be employed in a ring type oscillator that can provide a wider frequency tuning range than a conventional VCO delay cell.

BRIEF DESCRIPTION OF THE DRAWINGS

FIG. 3 is a block schematic diagram of a ring oscillator circuit according to an embodiment.

FIG. 4 is a table of simulation results of a ring oscillator circuit including a conventional delay cell circuit and a delay cell circuit according to an embodiment.

FIG. 5 is a block schematic diagram of a content addressable memory (CAM) according to an embodiment.

DETAILED DESCRIPTION OF THE EMBODIMENTS

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Figure 1:
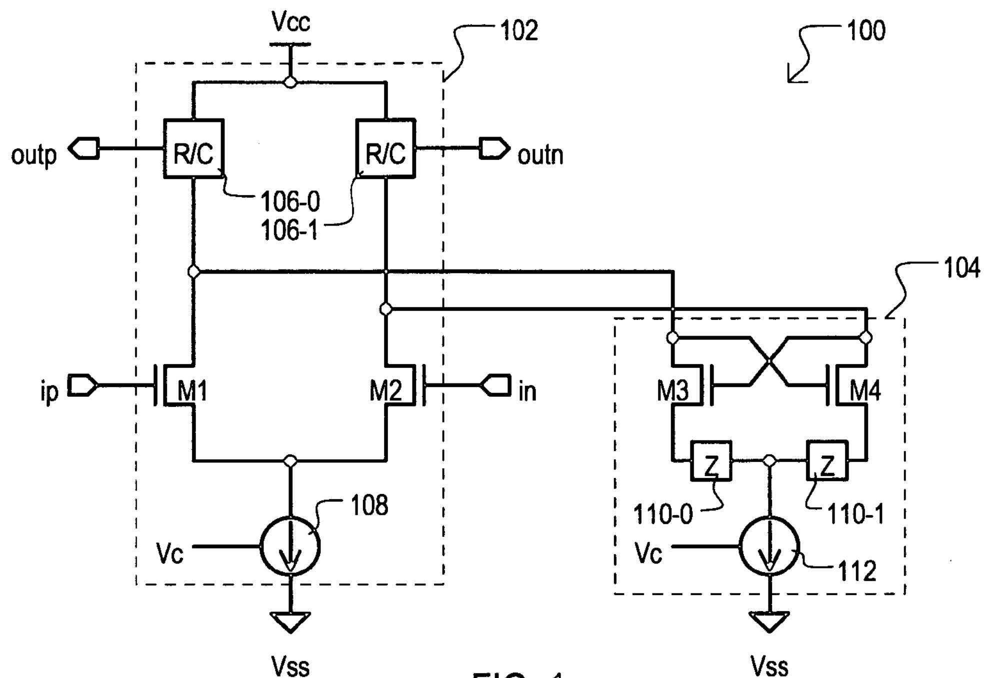
FIG. 1 is a circuit schematic diagram of a delay cell circuit according to an embodiment.

Referring to FIG. 1, a delay cell circuit according to an embodiment is set forth in a circuit schematic diagram and given the reference character 100. Delay cell circuit 100 may be used in a voltage controlled oscillator (VCO), as just one example. Delay cell circuit 100 may receive a differential input voltage at differential input terminals (ip and in) and may provide a differential output voltage at differential output terminals (outp and outn).

A delay cell circuit 100 may include a differential stage 102 and a cross-coupled stage 104.

Differential stage 102 may include transistors (M1 and M2), resistor/capacitor (R/C) circuits (106-0 and 106-1), and a variable current source 108. Transistors (M1 and M2) may have a common source configuration to form a differential pair. Transistor M1 may have a gate connected to differential Input terminal ip, a drain connected to R/C circuit 106-0, and a source connected to the source of transistor M2. Transistor M2 may have a gate connected to differential input in and a drain connected to R/C circuit 106-1. R/C circuit 106-0 may be connected between a power supply Vcc and a drain of transistor M1 and may provide differential output terminal outp. R/C circuit 106-1 may be connected between a power supply Vcc and a drain of transistor M2 and may provide differential output terminal outn. Variable current source 108 may be connected between commonly coupled sources of transistors (M1 and M2) and a ground potential VSS. Variable current source 108 may provide a current that is dependent upon a control voltage Vc. Transistors (M1 and M2) may be n-channel insulated gate field effect transistors (IGFETs), such as MOS transistors.

Cross-coupled stage 104 may include transistors (M3 and M4), impedance elements (110-0 and 110-1), and variable current source 112. Transistors (M3 and M4) can be in a cross-coupled configuration such that transistor M3 has a drain connected to the gate of transistor M4 and transistor M4 has a drain connected to the gate of transistor M3. Transistor M3 has a drain connected to the drain of transistor M1 and a source connected to a first terminal of impedance element 110-0. Transistor M4 has a drain connected to the drain of transistor M2 and a source connected to a first terminal of impedance element 110-1. Impedance elements (110-0 and 110-1) may each have a second terminal connected to a first terminal of variable current source 112. Variable current source 112 can have a second terminal connected to ground Vss. Variable current source 112 can provide a current that is dependent upon a control voltage Vc. Transistors (M3 and M4) may be n-channel IGFETs, such as MOS transistors.

Thus, unlike conventional delay circuit 600, delay circuit 100 can include impedance elements (110-0 and 110-1) disposed between the source of transistors (M3 and M4) respectively and a first terminal of variable current source 112.

As mentioned earlier, delay cell 100 may be incorporated in a ring oscillator comprising a voltage controlled oscillator. A delay for the delay cell 100 (and hence the oscillation frequency in a ring oscillator configuration) may be established by varying the rate at which current is sourced from both the differential stage 102 and cross-coupled stage 104. More particularly, a total current drawn by both transistors (M1 and M2) of differential pair may decrease as frequency increases. This may be accomplished by lowering the magnitude of control voltage Vc. Similarly, a total current drawn by both transistors (M3 and M4) of cross-coupled pair (M3 and M4) may increase as frequency decreases. A control voltage Vc can have a magnitude derived from a phase difference between a received clock and feedback block of a phase lock loop (PLL) circuit.

Figure 6:
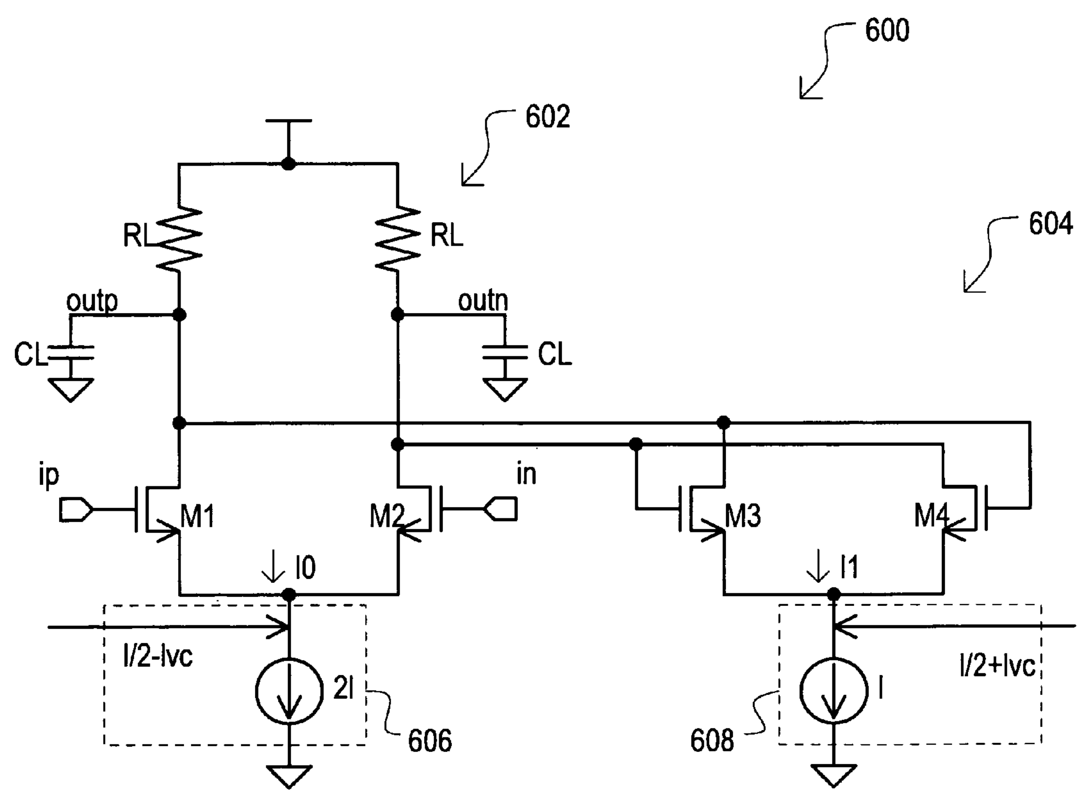
FIG. 6 is a circuit schematic diagram of a conventional delay cell circuit.

In such an arrangement, impedance elements (110-0 and 110-1) can reduce a gain of cross-coupled stage 104. More particularly, a gain of cross-coupled stage 104 can be less than that of differential stage 102, even when a current drawn by cross-coupled stage 104 is greater than that of differential stage 102. Thus, a ring oscillator employing delay cell circuit 100 may be capable of a wider frequency tuning range than a ring oscillator including conventional delay cell circuit 600 illustrated in FIG. 6.

Figure 2:
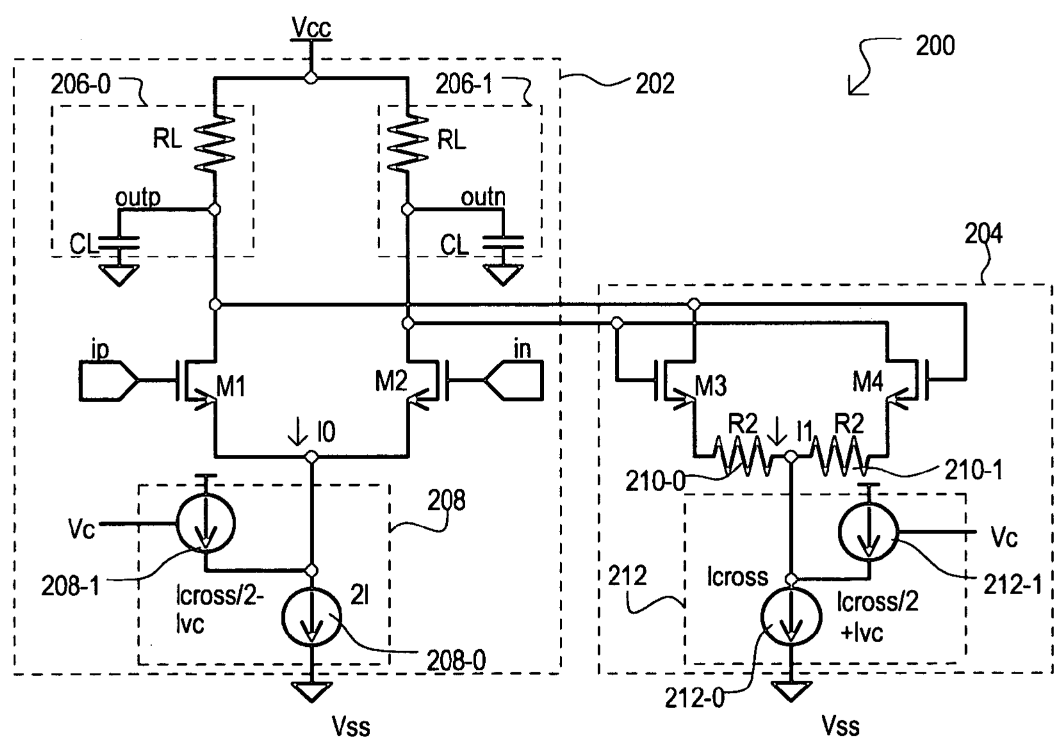
FIG. 2 is a circuit schematic diagram of a delay cell circuit according to an embodiment.

Referring now to FIG. 2, a delay cell circuit according to another embodiment is set forth in a circuit schematic diagram and given the general reference character 200. Delay cell circuit 200 may include similar constituents as delay cell circuit 100, and like constituents will be referred to by the same reference character, except the first digit is a "2" instead of a "1". Delay cell circuit 200 may be included as a delay cell circuit in a voltage controlled oscillator, as just one example. Delay cell circuit 200 may receive a differential input voltage at differential input terminals (ip and in) and may provide a differential output voltage at differential output terminals (outp and outn).

Delay cell circuit 200 may include a differential stage 202 and cross-coupled stage 204.

Differential stage 202 may differ from differential stage 102 in that more detailed R/C circuits (206-0 and 206-1) may be included and a variable current source 208 may be included. Each R/C circuit (206-0 and 206-1) may include a resistor RL and a capacitor CL. R/C circuit 206-0 may include a resistor RL having a first terminal connected to a power supply Vcc and a second terminal commonly connected to differential output terminal outp, a first terminal of a capacitor CL and commonly connected drains of transistors (M1 and M3). R/C circuit 206-1 may include a resistor RL having a first terminal connected to a power supply Vcc and a second terminal commonly connected to differential output terminal outn, a first terminal of a capacitor CL and commonly connected drains of transistors (M2 and M4). Each capacitor CL can include a second terminal connected to a ground Vss.

Variable current source 208 may include a constant current source component 208-0 and a variable current component 208-1. Constant current source component 208-0 may be connected between commonly connected sources of transistors (M1 and M2) and ground Vss. Variable current source component 208-1 may be connected between a power supply voltage Vcc and commonly connected sources of transistors (M1 and M2) and may receive a control voltage Vc. Constant current source component 208-0 may provide a current (2I). Variable current source component 208-1 may provide a current (Icross/2−Ivc). In the particular example shown, current Ivc can be proportional to a control voltage Vc in the range from about −Icross/2 to +Icross/2.

Cross-coupled stage 204 may differ from cross-coupled stage 104 in that cross-coupled stage may include resistors (210-0 and 210-1) and variable current source 212. Resistors (210-0 and 210-1) may each have an essentially matching resistance value of R2. Resistors (210-0 and 210-1) may be connected between a source of transistors (M3 and M4), respectively, and the variable current source 212. Thus, cross-coupled stage 204 differs from the cross-coupled stage 604 of conventional delay cell circuit 600 in that the sources of cross-coupled transistors (M3 and M4) are not commonly connected, but instead have intervening resistors (210-0 and 210-1).

Variable current source 212 may include a constant current source component 212-0 and a variable current component 212-1. Constant current source component 212-0 may be connected between commonly connected terminals of resistors (210-0 and 210-1) and ground Vss. Variable current source component 212-1 may be connected between a power supply voltage Vcc and commonly connected sources of resistors (210-0 and 210-1) and may receive a control voltage Vc. Constant current source component 212-0 may provide a current (Icross). Variable current source component 212-1 may provide a current (Icross/2+Ivc). In the particular example shown, current Ivc can be proportional to a control voltage Vc. Furthermore, a current Icross may be greater than a current I.

In such an arrangement, at a maximum frequency the following conditions generally occur:

$$Ivc=Icross/2,\ I0=2I,\ \text{and}\ I1=0.$$

However, at a minimum frequency, the following conditions generally occur:

$$Ivc=-Icross/2,\ I0=2I-Icross,\ I1=Icross\ (\text{with}\ Icross>I).$$

As but one very particular example, if Icross=1.2I, then I0=0.8I, and I1=1.2I. Accordingly, even at such a lower frequency, where I1>I0, a ring oscillator may continue to oscillate. This is in contrast to a conventional ring oscillator including conventional delay cell circuit 600, in which oscillations may cease once I1=I0.

In this way, a ring oscillator type VCO including stages comprising delay cell circuit 200 may provide a greater frequency tuning range than conventional approaches.

As noted above, delay cell circuits (100 and 200) can be included in a ring type oscillator circuit. One such example is illustrated in FIG. 3. Referring now to FIG. 3, a ring oscillator is set forth in a block schematic diagram and given the general reference character 300.

Ring oscillator 300 can include a number of delay cell circuits (302-0 to 302-*n*), arranged in a ring, where n is typically an odd number. Each delay cell circuit can receive a control voltage Vc. One or both output signals (outp and outn) can be tapped and conditioned by a conditioner circuit 304 to provide a voltage controlled oscillating signal VCO_OUT.

As noted above, delay cell circuits (100 and 200) may improve a tuning frequency range of a VCO as compared to a conventional delay cell circuit 600. Referring now to FIG. 4, a table sets forth simulation results showing a comparison between a VCO utilizing conventional delay cell circuit 600 and delay cell circuit 200. The simulation results are for delay cells having essentially identical circuit elements, except delay cell circuit 200 includes resistors R2 in cross-coupled stage 204. The simulation was for a ring oscillator of 4 delay cell circuits having circuit elements with the following values.

M1/M2/M3/M4=W/L=6.8 μm/0.2 μm

CL=100 fF

RL=1000Ω

FIG. 4 shows one column for a ring oscillator using a conventional delay circuit 600 (Old circuit), and two columns for a ring oscillator using delay cell circuit 200 according to an embodiment, one for a resistor R2 value 75Ω and one for a resistor R2 value of 150Ω. Each such column shows a resulting ring oscillator frequency for a given control voltage value Vc. It is understood that in the arrangement shown, as control voltage decreases, control current Ivc increases.

As shown, a ring oscillator using conventional delay cell circuit 600 fails to oscillate at control voltages of 115 mV and greater thus providing a lower limit frequency of about 409.5 MHz. In contrast, a ring oscillator using delay cell circuit 200 according to an embodiment of the present invention, considerably larger control voltage can provide for greater frequency ranges. In particular, when a resistor (210-0 and 210-1) has a resistance value R2=75Ω, a control voltage may be at least as high as 135 mV to provide a lower operating frequency of at least 333.6 MHz and when a resistor (210-0 and 210-1) has a resistance value R2=150Ω, a control voltage may be at least as high as 135 mV to provide a lower operating frequency of at least 306 MHz.

Thus, it is shown, that by providing an impedance device, such as resistors (210-0 and 210-1) in cross-coupled circuit (104 and 204), a gain of the cross-coupled circuit may be attenuated and a tuning frequency range of a VCO using delay cell circuits (100 and 200) may be improved. In this way, resistors (210-0 and 210-1) may be conceptualized as gain attenuating resistors, gain attenuating devices and/or a gain attenuating circuit.

Referring now to FIG. 5, a content addressable memory (CAM) device according to one embodiment is set forth and given the general reference character 500. CAM device 500 can include a phase locked loop (PLL) circuit 502 that receives an external clock CLK_EX and provides a "locked" Internal clock CLK_INT. Such a PLL circuit 502 can include a ring oscillator 502-0 having delay cell circuits 502-1 like delay cell circuits (100 and 200) Illustrated in FIGS. 1 and 2 above. An internal clock CLK_INT can be provided to a clock circuit 504 which can provide clock timing signals to one or more CAM arrays (506-0 to 506-*n*). Clock timing signals may be provided to control circuits (not shown) providing control signals to each CAM array (506-0 to 506-*n*), as just one example.

A resulting CAM device 500 can provide timing signals having an advantageously wider operating range, without having to adjust or include frequency divider circuits, or the like.

Of course, while the above embodiments have shown a delay cell circuit (100 and 200) that may be included in a ring oscillator, more particularly within a ring type VCO, and even more particularly within a VCO of a PLL, the present invention should not be limited to such particular applications.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A delay cell circuit, comprising:

a differential stage coupled to receive a differential input voltage at first and second differential input terminals and provide a differential output voltage at first and second differential output terminals; and a cross-coupled stage coupled to the differential output terminals and including a first gain attenuating resistor and a first variable current source coupled to commonly coupled second terminals of the first and a second gain attenuating resistor, the first variable current source including a first constant current source component coupled between the commonly coupled second terminals of the gain attenuating resistors and a first reference voltage and a first variable current source component coupled between the commonly coupled second terminals of the gain attenuating resistors and a second reference voltage and the first variable current source component varies in accordance with a control voltage.

2. The delay cell circuit of claim 1, wherein the cross-coupled stage includes the second gain attenuating resistor.

3. The delay cell circuit of claim 2, wherein:

the cross-coupled stage includes a first transistor having a gate coupled to the first differential output terminal, a drain coupled to the second differential output terminal, and a source coupled to a first terminal of the first gain attenuating resistor; and a second transistor having a gate coupled to the second differential output terminal, a drain coupled to the first differential output node, and a source coupled to a first terminal of the second gain attenuating resistor.

4. The delay cell circuit of claim 2, wherein:

the differential stage includes a first differential transistor having a gate coupled to the first differential input terminal, a drain coupled to the first differential output terminal, and a source;

a second differential transistor having a gate coupled to the second differential input terminal, a drain coupled to the second differential output terminal, and a source commonly coupled to the source of the first differential transistor; and a second variable current source coupled to the commonly coupled sources of the first and second differential transistors.

5. The delay cell circuit of claim 4, wherein:

the second variable current source includes a second constant current source component coupled between the commonly coupled sources of the first and second differential transistors and a first reference voltage and a second variable current source component coupled between the commonly coupled sources of the first and second differential transistors and a second reference voltage and the second variable current source component varies in accordance with a control voltage.

6. The delay cell circuit of claim 5, wherein:

the delay cell circuit comprises a portion of a voltage control oscillator and the second variable current source component decreases current as frequency of oscillation increases.

7. The delay cell circuit of claim 1, wherein:

the delay cell circuit comprises a portion of a voltage control oscillator and the first variable current source component increases current as frequency of oscillation increases.

* * * * *